(12) United States Patent
Riccio et al.

(10) Patent No.: US 6,518,816 B2
(45) Date of Patent: Feb. 11, 2003

(54) VOLTAGE TRANSLATOR, PARTICULARLY OF THE CMOS TYPE

(75) Inventors: Ettore Riccio, Vimodrone (IT); Laura Varisco, Cernusco Lombardone (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 55 days.

(21) Appl. No.: 09/823,924

(22) Filed: Mar. 30, 2001

(65) Prior Publication Data

US 2002/0011873 A1 Jan. 31, 2002

(30) Foreign Application Priority Data

Mar. 31, 2000 (IT) .......................................... MI00A0689

(51) Int. Cl.[7] .............................................. H03L 5/00
(52) U.S. Cl. ......................................... 327/333; 326/68
(58) Field of Search .................................. 327/437, 306, 327/333; 326/62, 68, 80, 81, 63

(56) References Cited

U.S. PATENT DOCUMENTS 6,417,716 B1 * 7/2002 Riccio ........................ 327/333

* cited by examiner

*Primary Examiner*—Dinh T. Le
(74) *Attorney, Agent, or Firm*—Lisa K. Jorgenson; E. Russell Tarleton; SEED IP Law Group PLLC (57) ABSTRACT

A CMOS voltage translator having a differential cell circuit portion connected between first and second supply voltage references, and including first and second transistor pairs connected together in series between the supply voltage references. A first divider of the first supply voltage reference for producing a first reduced supply voltage reference on a first internal circuit node, and a second divider of the first supply voltage reference for producing a second reduced supply voltage reference on a second internal circuit node is included, as well as a multiplexer circuit portion connected between the first and second reduced supply voltage references to supply first and second reference voltages to the differential cell circuit portion, respectively on third and fourth internal circuit nodes.

16 Claims, 6 Drawing Sheets

VOLTAGE TRANSLATOR, PARTICULARLY OF THE CMOS TYPE

TECHNICAL FIELD

This invention relates to a voltage translator, particularly of the CMOS type.

Specifically, the invention relates to a CMOS voltage translator that has a differential cell circuit portion connected between first and second supply voltage references, and first and second transistor pairs connected together in series between the supply voltage references.

BACKGROUND OF THE INVENTION

As is known, voltage translators are used in several applications, especially in integrated circuits, for the purpose of bringing a supply voltage of relatively low level (typically 3.3 to 5 V) to conveniently higher and/or lower values dependent on the requirements of various circuitry connected to the voltage supply.

A voltage translator is applied to a MOS transistor, where a high voltage may impair its reliability by causing the gate oxide to break down.

Figure 1A:
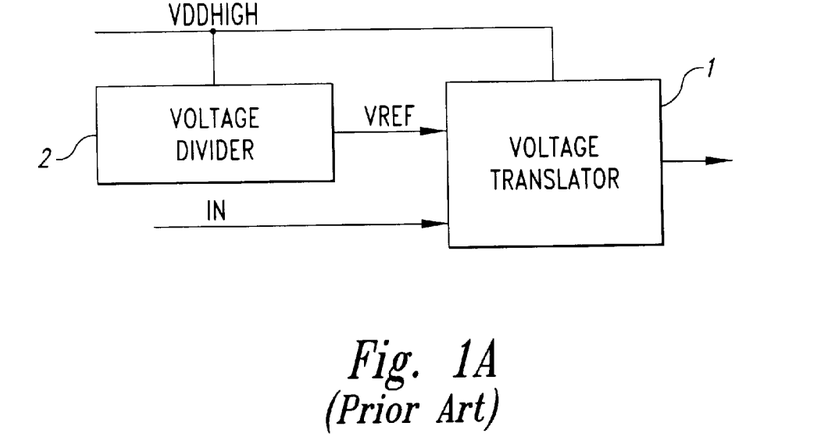
FIGS. 1A and 1B show, respectively, in schematic and more detailed form, a voltage translator according to the prior art.
Figure 1B:
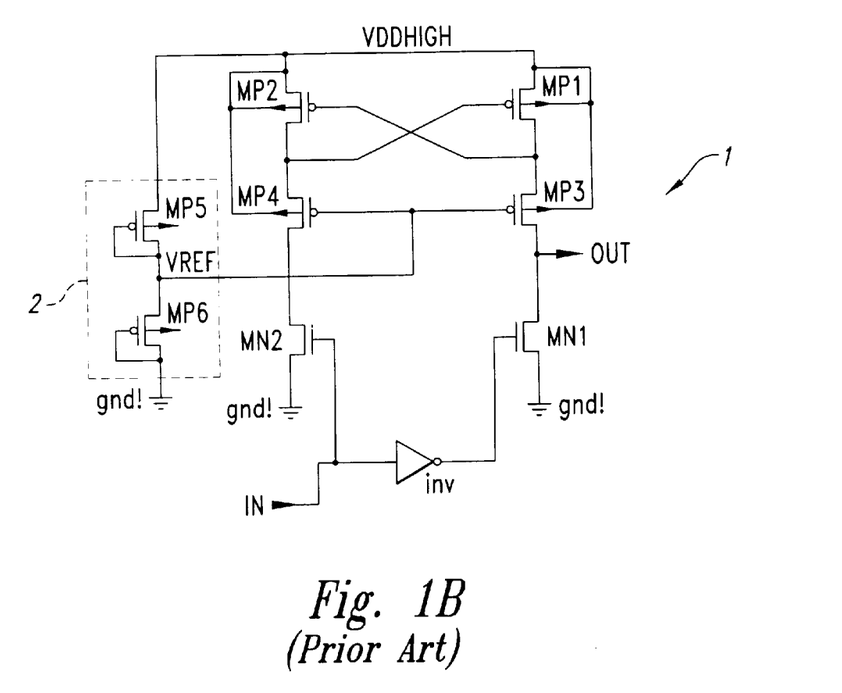

A prior solution, wherein an upper limit is placed on the value of the high-voltage supply, is shown generally in FIG. 1A and in more detail in FIG. 1B. A conventional voltage translator 1, being supplied a high-voltage reference VDDHIGH, is input a reference voltage VREF obtained from a voltage divider 2, with the latter being supplied with the high-voltage reference VDDHIGH and an input signal VIN.

It should be noted that the high-voltage reference VDDHIGH lies, for example, above the highest voltage value that can be applied to a MOS transistor.

In particular, the high-voltage reference VDDHIGH is applied to a first pair of P-type MOS transistors, MP1 and MP2, which are cross-connected together such that their gate and drain terminals are respectively connected to the source terminals of a second pair of P-type MOS transistors, MP3 and MP4. The gate terminals of the second transistor pair receive a reference voltage VREF from the voltage divider 2.

Also, the drain terminals of the second transistor pair MP3, MP4 are respectively connected to the source terminals of a pair of N-type MOS transistors, MN1 and MN2, whose gate terminals are driven respectively by the input signal VIN, presented at an input terminal IN of the voltage translator 1, and its inverse, i.e., a low-voltage reference VDDLOW obtained from an inverter INV which is connected between the input terminal IN and the gate terminal of the transistor MN2. The voltage translator 1 also has an output terminal OUT coinciding with the drain terminal of the transistor MP3.

Furthermore, the bulk terminals of the transistors MP1, MP2, MP3 and MP4 are connected to the high-voltage reference VDDHIGH.

As shown in FIG. 1B, the voltage divider 2 comprises first and second P-type MOS transistors, MP5 and MP6, in a diode configuration, which transistors are connected, in series with each other, between the high-voltage reference VDDHIGH and a ground reference GND.

In the instance of the transistors MP5 and MP6 being selected identical with each other, a value of the reference voltage VREF is obtained which is half that of the high voltage VDDHIGH, namely:

VREF=VDDHGH/2.

The operation of the voltage translator 1 under different operational conditions will now be reviewed.

In the event of the value of an input signal VIN applied to the input terminal IN being equal to that of the low-voltage reference VDDLOW, the drain terminals of the transistors MP1 and MP3 would be at VDDHIGH, and the drain terminals of the transistors MP4 and MP2 would be at GND and VDDHIGH+Vth(MP4), respectively, where Vth (MP4) is the threshold voltage value of the transistor MP4.

It should be noted that the terminals of all P-type MOS transistors have a voltage drop of VDDHIGH+Vth(PMOS), where Vth(PMOS) is the threshold voltage value of a PMOS transistor. This value is usually suitable for supply to the transistors under consideration. Otherwise, additional stages of the cascode type, that is additional pairs of PMOS transistors in the same configuration as transistors MP3 and MP4, would have to be provided.

It should also be noted that the drain terminal of transistor MN1 would be at VDDHIGH, this value being an acceptable one only because NMOS transistors of the drift type are used instead of standard NMOS transistors.

When the input signal VIN at the input terminal IN is changed from a value equal to GND to a value equal to the low-voltage supply reference VDDLOW, the drain terminal of the transistor MN1 is brought down to GND, and the source terminal of the transistor MP3 up to the value of VREF+Vth(MP3), where Vth(MP3) is the threshold voltage value of the transistor MP3; as the voltage across the gate and source terminals of the transistor MP3 drops below the threshold voltage Vth(MP3) of the transistor MP3, the latter is turned off.

Likewise, when the voltage value, equal to VDDHIGH−VREF+Vth(MP3), across the gate and source terminals of the transistor MP2 rises above the value of the threshold voltage of the latter, the transistor MP2 is turned on and the transistor MP1 turned off; the value of the voltage at the output terminal OUT of the voltage translator 1 rises to the high voltage VDDHIGH.

In this condition of operation, the greatest drop in voltage across the terminals of the PMOS transistors comprising the voltage translator 1 would still be VDDHIGH+Vth(PMOS).

Thus, a prerequisite for the voltage translator 1 to operate correctly, is that all the PMOS transistors contained in it should be capable of withstanding that voltage maximum on their gate oxides.

Figure 2A:
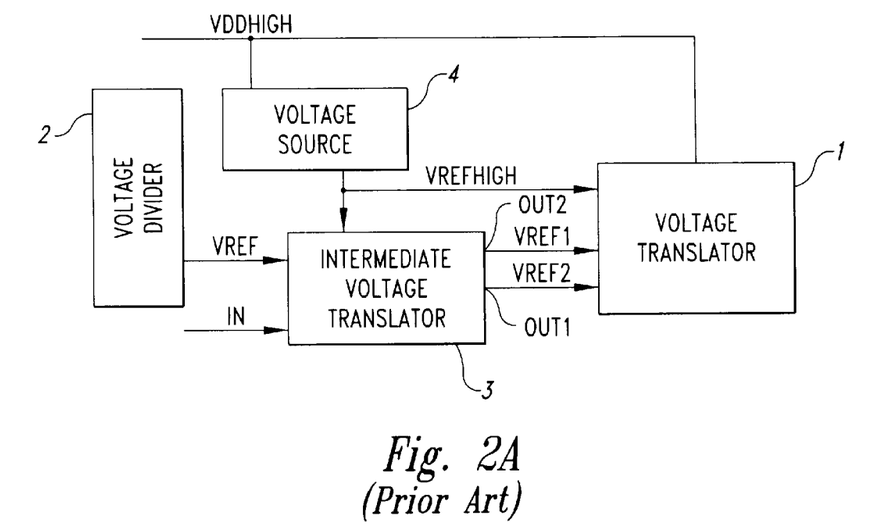
FIGS. 2A and 2B show, respectively, in schematic and more detailed form, a modification of a voltage translator according to the prior art.
Figure 2B:
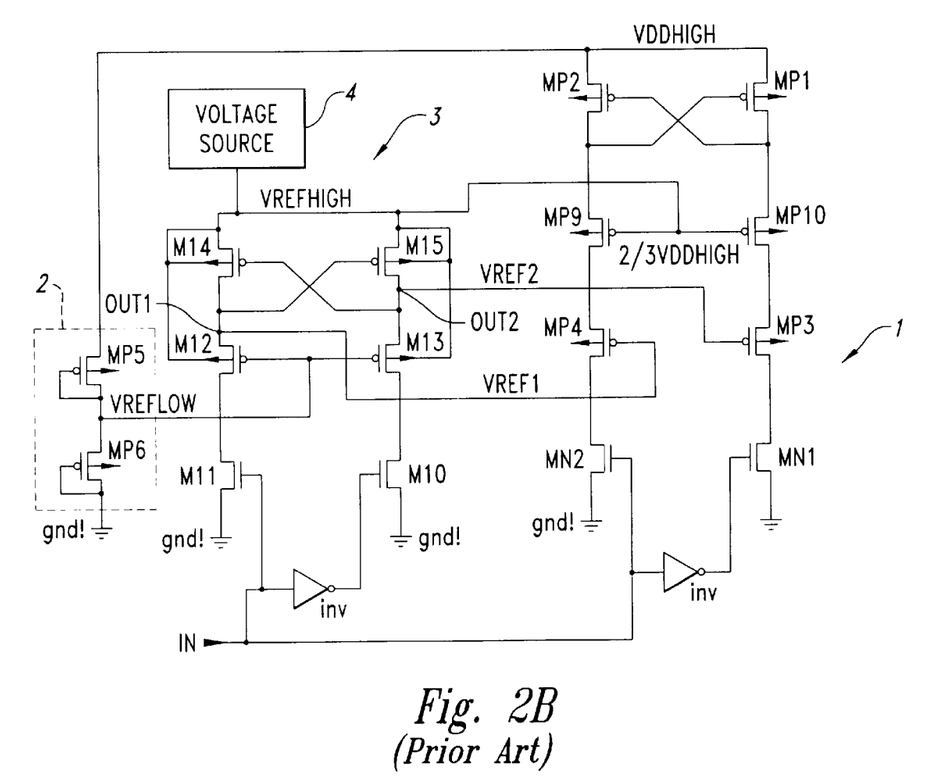

Another prior solution is shown generally in FIG. 2A and in more detail in FIG. 2B. Similar elements carry the same reference numerals and will not be described further.

In particular, it can be seen that an intermediate voltage translator 3 has been connected between the voltage translator 1 and the voltage divider 2, which intermediate translator 3 is supplied a high reference voltage VREFHIGH generated from a voltage source 3 for low-impedance loads, itself connected to the high-voltage reference VDDHIGH.

The intermediate translator 3 is input the reference voltage VREF and the input signal VIN, and supplies first and second intermediate reference voltages, VREF and VREF2, to the translator 1. The voltage translator 1 is further input the high reference voltage VREFHIGH.

In particular, the intermediate translator 3 is configured same as the translator 1, but is supplied the high reference voltage VREFHIGH.

In particular, this high reference voltage VREFHIGH is supplied to a first pair of P-type MOS transistors, M14 and M15, which are cross-connected together such that their gate and drain terminals are respectively connected to the source terminals of a second pair of P-type MOS transistors, M12 and M13. The gate terminals of the second transistor pair receive a reference voltage VREF from the voltage divider 2.

The drain terminals of the second transistor pair M12, M13 are respectively connected to the source terminals of a further pair of N-type MOS transistors, M11 and M10, having their gate terminals driven respectively by the input signal VIN, presented at an input terminal IN of the voltage translator 1, and its inverse, i.e., a low-voltage reference VDDLOW obtained from a further inverter INV being connected between the input terminal IN and the gate terminal of the transistor MN2.

The intermediate translator 3 has a first output terminal OUT1 coinciding with the drain terminal of the transistor M14, and has a second output terminal OUT2 coinciding with the drain terminal of the transistor M15. In particular, the first output terminal OUT1 is to supply said first intermediate reference voltage VREF1 to the gate terminal of the transistor MP4 in the voltage translator 1, and the second output terminal OUT2 is to supply said second intermediate reference voltage VREF2 to the gate terminal of the transistor MP3 in the voltage translator 1.

Lastly, yet another pair of PMOS transistors, MP9 and MP10, are connected between the first PMOS transistor pair MP1, MP2 and the second PMOS transistor pair MP3, MP4 of the voltage translator 1. The transistors MP9 and MP10 have their gate terminals connected together and connected to the voltage reference VREFHIGH from the voltage source 4.

The configuration shown in FIGS. 2A and 2B is essentially a cascade of voltage translators such as the conventional translator 1, with intermediate voltage references for dealing with the low-impedance nodes. In particular, the values of the first and second intermediate reference voltages, VREF1 and VREF2, depend on the values taken by the input voltage VIN.

In actual practice, however, the first intermediate reference voltage should have an extremely low output impedance to allow the intermediate translator to perform as expected.

The underlying technical problem of this invention is to provide a voltage translator that can accept great voltage drops across the oxide terminals of its PMOS transistors, and that exhibits structural and functional features appropriate to overcome the limitations with which prior voltage translators are beset.

SUMMARY OF THE INVENTION

The principle on which the disclosed embodiment of the invention stands is one of having the values of internally generated reference voltages VREF1 and VREF2 regulated automatically, using a pair of voltage dividers and cascoded voltage-translating stages.

Based on this principle, the technical problem is solved by a CMOS voltage translator having a differential cell circuit portion connected between first and second supply voltage references, and having first and second transistor pairs connected together in series between said supply voltage references, further including a first divider of the first supply voltage reference for producing a first reduced supply voltage reference on a first internal circuit node, and a second divider of the first supply voltage reference for producing a second reduced supply voltage reference on a second internal circuit node. A multiplexer circuit portion connected between the first and second reduced supply voltage references is provided to deliver first and second reference voltages to the differential cell circuit portion on third and fourth internal circuit nodes, respectively.

The features and advantages of a disclosed embodiment of a voltage translator according to the invention will be apparent from the following description of an embodiment thereof, given by way of non-limitative example with reference to the accompanying drawings.

DETAILED DESCRIPTION OF THE INVENTION

Figure 3A:
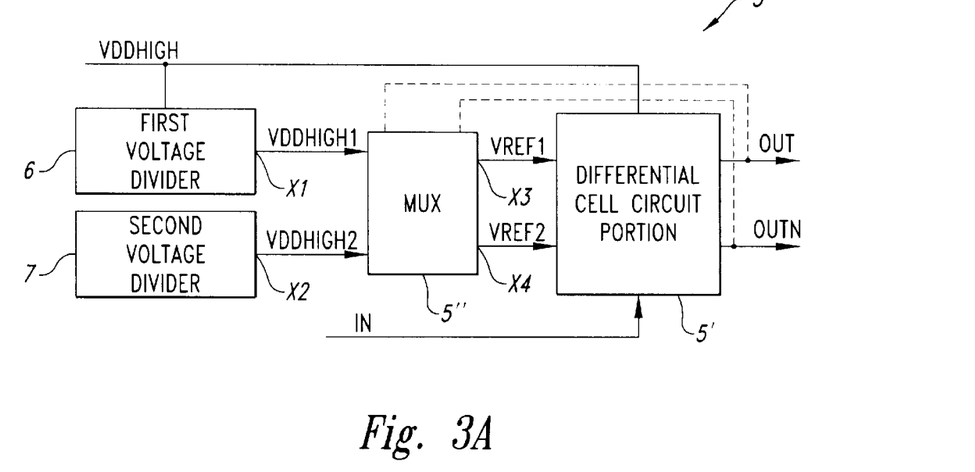
FIGS. 3A and 3B show, respectively, in schematic and more detailed form, an embodiment of a voltage translator according to this invention.
Figure 3B:
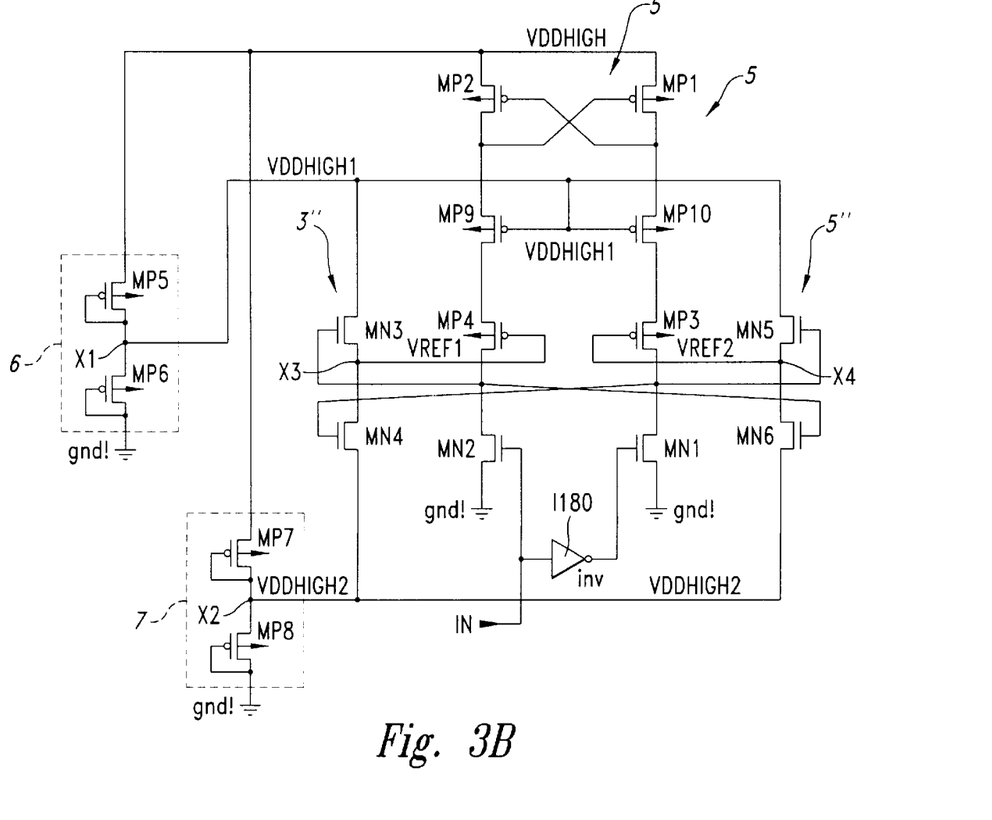

With reference to the drawings, and in particular to FIGS. 3A and 3B thereof, a voltage translator according to this invention is generally shown at 5 in schematic form.

Elements that have structural and functional analogues in the voltage translator 1 according to FIGS. 1A, 1B, 2A, and 2B are denoted by the same references throughout this description and the drawings.

In particular, the voltage translator 5 comprises a differential cell circuit portion 5' containing a first pair of P-type MOS transistors, MP1 and MP2, which have their source terminals connected to a first supply voltage reference, specifically a high-voltage reference VDDHIGH, and their gate and drain terminals cross-connected to the source terminals of a second pair of P-type MOS transistors, MP3 and MP4, in a cascode configuration through a third pair of P-type MOS transistors, MP9 and MP10.

In addition, the drain terminals of transistors MP3 and MP4 are connected respectively to the source terminals of a fourth pair of N-type MOS transistors, MN1 and MN2, the gate terminals of which are driven respectively by an input signal VIN, presented at an input terminal IN of the voltage translator 5, and the inverse of said signal, provided by an inverter INV which is connected between the input terminal IN and the gate terminals of transistors MN1 and MN2.

Same as in the voltage translator according to the prior art, the NMOS transistors MN1 and MN2 are drift transistors, that is transistors constructed to accept a high voltage value, namely VDDHIGH, on their drain terminals only.

The voltage translator 5 further comprises first and second voltage dividers, 6 and 7, connected between said high-voltage reference VDDHIGH and ground GND.

In particular, the first voltage divider 6 comprises first and second P-type MOS transistors, MP5 and MP6, in a diode configuration, which transistors are connected in series with each other between the high-voltage reference VDDHIGH and ground GND, so as to generate a first reduced voltage reference VDDHIGH1 on a first internal circuit node X1 defined by the gate terminal of transistor MP5.

The second voltage divider 7 likewise comprises first and second P-type MOS transistors, MP7 and MP8, in a diode configuration, which transistors are connected in series with each other between the high-voltage reference VDDHIGH and ground GND, so as to generate a second reduced voltage reference VDDHIGH2 on a second internal circuit node X2 defined by the gate terminal of transistor MP7.

Also, said first internal circuit node X1 is connected to the gate terminals shared by the transistors MP9 and MP10 of the third transistor pair.

Advantageously in this invention, the first voltage divider 6 will set the value of the voltage VDDHIGH1 on the first internal circuit node X1 at 2/3VDDHIGH, and he second voltage divider 7 will set the value of the voltage VDDHIGH2 on the second internal circuit node X2 at 1/3VDDHIGH.

Finally, the voltage translator 5 comprises a fifth pair of N-type MOS transistors, MN3 and MN4, and a sixth pair of N-type MOS transistors, MN5 and MN6, connected together into a multiplexer 5".

In particular, the transistors MN3 and MN4 of said fifth pair are connected, in series with each other, between said first VDDHIGH1 and second VDDHIGH2 reduced voltage references, and the transistors MN5 and MN6 of said sixth pair are connected, in series with each other, between said first VDDHIGH1 and second VDDHIGH2 reduced voltage references. Further, the gate terminal of transistor MN3 is connected to the gate terminal of transistor MN6, and the gate terminal of transistor MN4 is connected to the gate terminal of transistor MN5.

Advantageously in this invention, a third internal circuit node X3 between the transistors MN3 and MN4 of said fifth transistor pair will supply a first intermediate reference voltage VREF1, and a fourth internal circuit node X4 between the transistors MN5 and MN6 of said sixth transistor pair supply a second intermediate reference voltage VREF2.

Further, said third internal circuit node X3 is connected to the gate terminal of transistor MP4, and said fourth internal circuit node X4 connected to the gate terminal of transistor MP3.

Briefly, the voltage translator 5 of this invention will adjust the value of the reference voltages VREF1 and VREF2 to suit the value of the input signal VIN.

As the value of the input signal VIN goes "low", that is goes down to the value of the ground reference GND, the drain terminals of transistors MP4, MP2 and MP9 go up to the high voltage value VDDHIGH.

Under these conditions, the voltage value applied to the gate terminal of transistor MP4, namely the first reference voltage VREF1, goes to a voltage value equal 2/3VDDHIGH, assuming the difference VDDHIGH−2/3VDDHIGH=1/3VDDHIGH to be a safe value for proper performance of the gate oxides of the PMOS transistors.

As the value of the input signal VIN goes "high", that is to the value of the low-voltage reference VDDLOW, since the value VIN may vary between VDDLOW and round GND, the gate terminal of transistor MP4 will go down to the ground value GND, because of transistor MN2 being turned on.

Under these conditions, the voltage value applied to the gate terminal of transistor MP4, namely the first reference voltage VREF1, must go to a voltage value equal 1/3VDDHIGH, again assuming this to be a safe value for proper performance of the gate oxides of the PMOS transistors.

The symmetrical arrangement of transistors MN1, MP3, MP10 and MP1 results in the behavior of the second reference voltage VREF2 reflecting what has been stated before in relation to the first reference voltage VREF1 in a symmetrical manner.

Thus, the voltage translator 5 of this invention does solve the problem of providing correct values for the reference voltages VREF1 and VREF2 using a standard CMOS process.

The operation of the voltage translator 5 according to this invention will now be described in detail.

Upon the value of the input signal VIN going "high", that is to the value of the low-voltage reference VDDLOW, the following will occur:

transistor MN2 is turned on and transistor MN1 off;

transistor MN3 is turned off, taking n this case VDDLOW>(1/2VDDHIGH−Vth(MP1));

transistor MN5 is turned on, because the drain terminal of transistor MN1 is at VDDHIGH.

In fact, the value of the second reference voltage VREF2 will be 2/3VDDHIGH and produce a voltage drop of 1/2VDDHIGH across the gate oxide of transistor MP3.

the drain terminal of transistor MP2, corresponding to the source terminal of transistor MP9, is at a value 2/3VDDHIGH+Vth(MP9);

transistor MP1 is turned on;

the drain terminal of transistor MN1 is at the value VDDHIGH, through transistors MP10 and MP3; and transistor MN4 is turned on, with the value of the first reference voltage VREF1 being 1/3VDDHIGH, so that a voltage drop of 1/3VDDHIGH will occur across the gate oxide of transistor MP4.

Conversely, as the value of the input signal VIN is at a "low", that is goes to the value of the ground reference GND:

transistor MN2 is turned off, and transistor MN1 on;

the drain terminal of transistor MN1 goes to the value of ground GND, thus causing transistors MN4 and MN5 to be turned off.

It should be noted that in this case the values of the reference voltages VREF1 and VREF2 would be "floating", but the translator 5 as a whole has entered a new steady state whereby the reference voltages VREF1 and VREF2 are driven correctly.

The drain terminal of transistor MP1, corresponding to the source terminal of transistor MP10, goes to a voltage value 2/3VDDHIGH+Vth(MP10);

transistor MP2 is turned on;

the drain terminal of transistor MN2 goes to the value of the high voltage VDDHIGH, through transistors MP9 and MP4; and transistors MN3 and MN6 are turned on, since the value of the first reference voltage VREF1 has gone to a value 2/3VDDHIGH, while the second reference voltage VREF2 has gone to a value of 1/3VDDHIGH, so that a voltage drop of 1/3VDDHIGH is caused to occur across the gate oxides of all PMOS transistors.

Likewise, the transition of the input voltage VIN from a "low" equal to the ground voltage GND to a "high" equal to the supply voltage VDDLOW will initiate a symmetrical behavior of the voltage translator 5 according to the invention.

A voltage translator is thus obtained that is effective in keeping the voltage drop across the gate oxides of the PMOS transistors it contains below a critical value, thereby ensuring correctness of its overall performance. This it achieves for a minimal number of added components compared to conventional designs, and by the use of just a voltage source for driving high-impedance nodes.

It should be noted that the known HCMOS7 technology produces standard PMOS transistors capable of accepting a voltage drop of no more than 3 V across their gate oxide.

The voltage translator 5 of this invention has been simulated by the applicant, using an ELDO program with HCMOS7 technology, standard process models, and the following set of operational conditions:

VDDHIGH=8 V

VDDLOW=2.4 V

Operating temperature: 25° C.

VREF=VDDHIGH/2=4 V; which value produces least voltage drop across the gate oxides of the MOD transistors utilized.

Figure 4A:
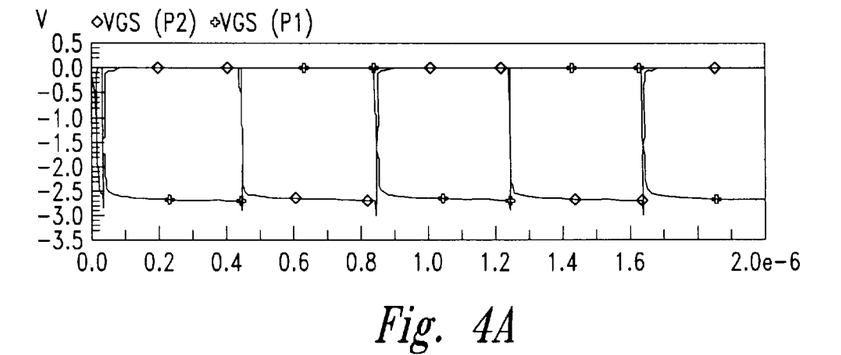
FIGS. 4A to 4C, 5A to 5D, and 6A to 6D show comparative patterns of internal signals of the translators of FIGS. 1A and 1B, 2A and 2B, and 3A and 3B.
Figure 4B:
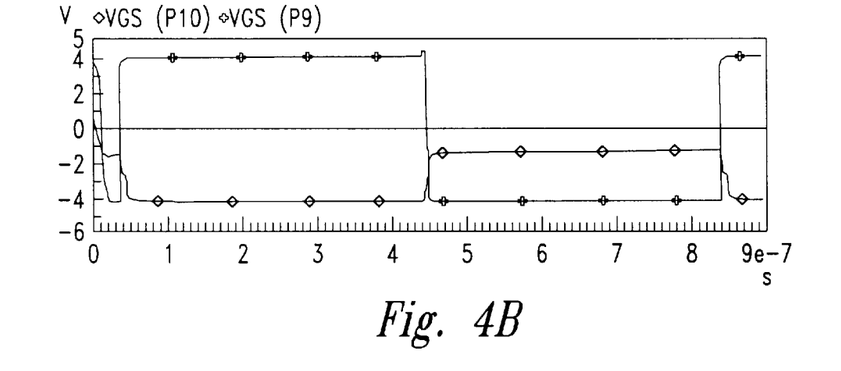
Figure 4C:
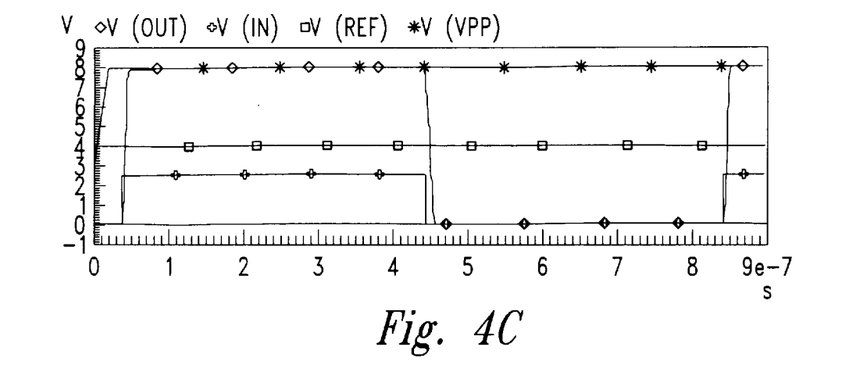
Figure 5A:
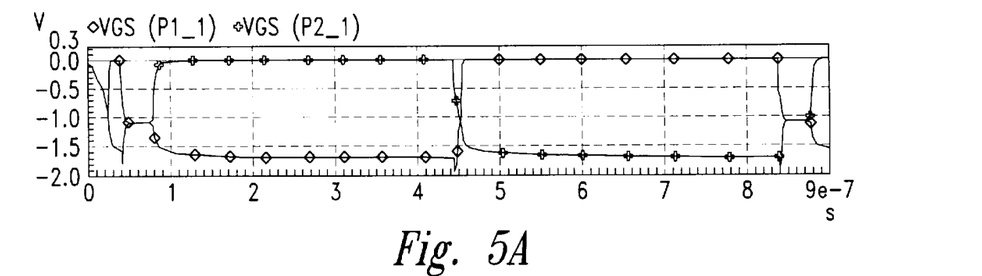
Figure 5B:
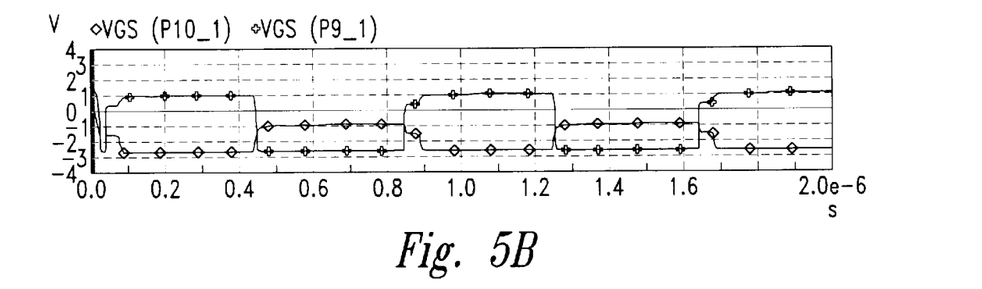
Figure 5C:
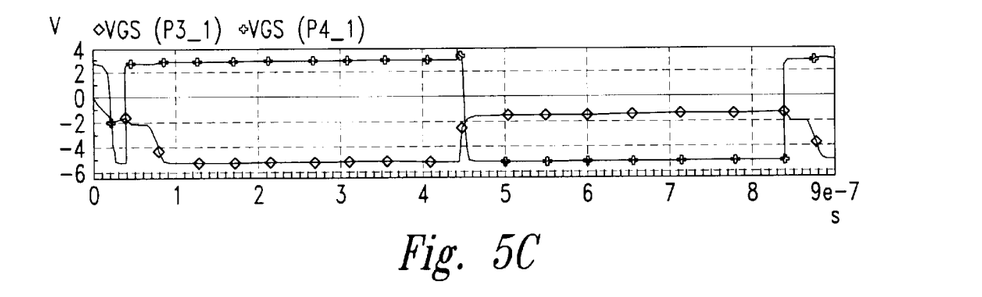
Figure 5D:
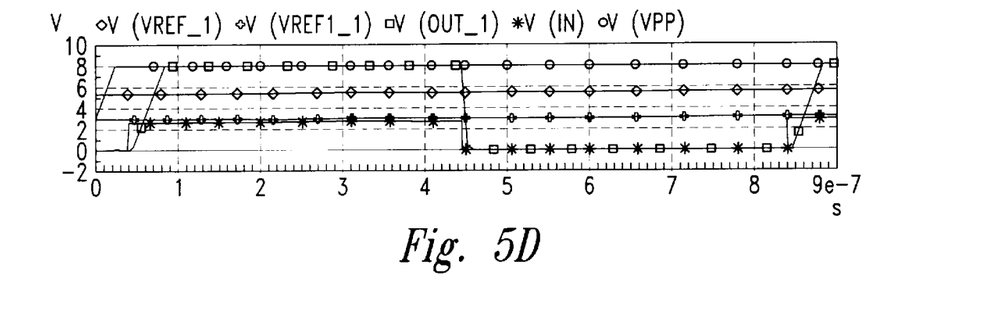
Figure 6A:
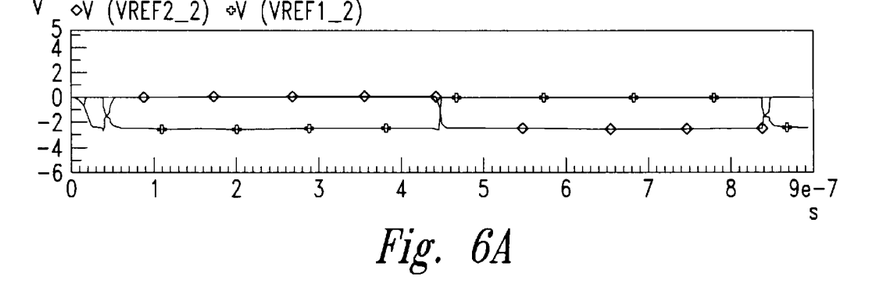
Figure 6B:
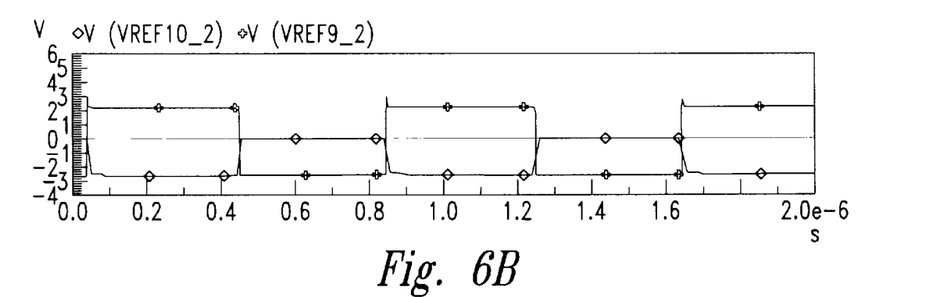
Figure 6C:
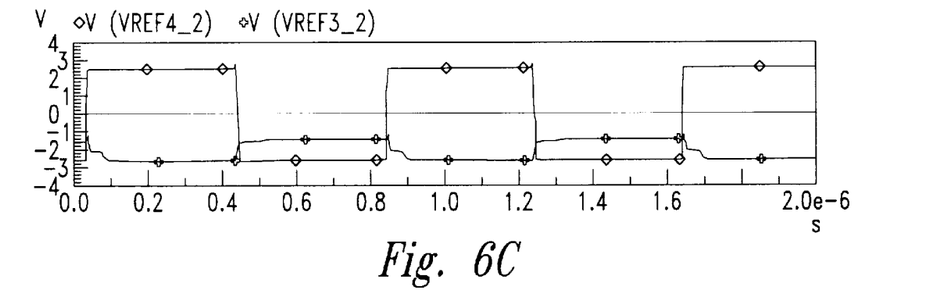
Figure 6D:
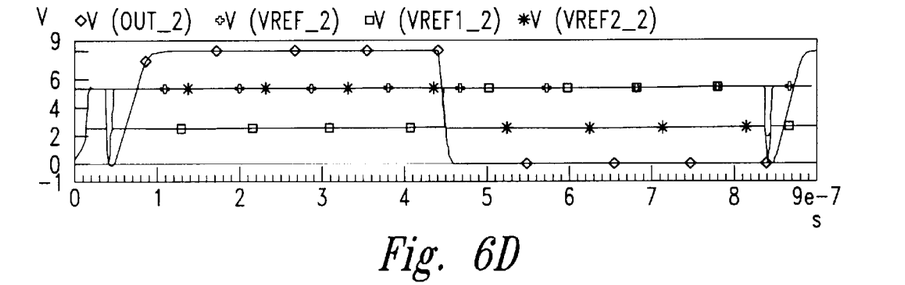

FIGS. 4A to 4C show, in comparison, results of the above simulation when carried out on one prior art translator.

It is readily seen that the gate-source voltage Vgs of the PMOS transistors in the cascode stage exceeds 4 V. This undermines the reliability of the PMOS transistors.

FIGS. 5A to 5D show, in comparison, results of the simulation when carried out on another prior art translator having a double cascode structure biased by set reference voltages (viz. 2/3VDDHGH=5.3 V and 1/3VDDHGH=2.8 V).

Here again, the values of the gate-source voltages of the PMOS transistors employed in the cascode structures are above a safe level for proper transistor performance.

Finally, FIGS. 6A to 6D show, in comparison, results of the simulation as carried out on the subject translator of this invention.

The operational conditions being the same as before, the following reference voltage values have been found:

VREF1=5.2 V; and

VREF2=2.8 V.

In this case, the gate-source voltage values Vgs of the PMOS transistors used do not exceed, however, 3 Volts.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A CMOS voltage translator, comprising:
   a differential cell circuit portion connected between first and second supply voltage references, and comprising first and second transistor pairs connected together in series between said supply voltage references;
   a first divider of said first supply voltage reference for producing a first reduced supply voltage reference on a first internal circuit node, and a second divider of said first supply voltage reference for producing a second reduced supply voltage reference on a second internal circuit node; and
   a multiplexer circuit portion connected between said first and second reduced supply voltage references to supply first and second reference voltages to said differential cell circuit portion on third and fourth internal circuit nodes, respectively.

2. The CMOS voltage translator of claim 1 wherein said fourth and third internal circuit nodes are connected respectively to the gate terminals of the transistors in said second pair.

3. The CMOS voltage translator of claim 1 wherein said multiplexer circuit portion comprises first and second transistors connected in series with each other and between said first and second reduced supply voltage references, and further comprising third and fourth transistors connected in series with each other and between said first and second reduced supply voltage references, said first and fourth transistors having their gate terminals connected together, as have said second and third transistors.

4. The CMOS voltage translator of claim 1 wherein said differential cell circuit portion comprises a third transistor pair connected between said first and second transistor pairs and having the gate terminals connected to said first reduced supply voltage reference.

5. The CMOS voltage translator of claim 1 wherein said differential cell circuit portion comprises a fourth transistor pair the gate terminals whereof are driven respectively by an input signal, presented at an input terminal of the translator, and its inverse, as obtained from an inverter connected between the input terminal and the gate terminals of the transistors in said fourth pair.

6. The CMOS voltage translator of claim 5 wherein the values of said first and second reference voltages depend on the value of the input signal presented at said input terminal of the translator.

7. The CMOS voltage translator of claim 1 wherein said first voltage divider comprises a pair of diode-configured transistors connected together at said first internal circuit node and a third voltage reference, said first voltage divider sized to generate said first reduced voltage reference that is two-thirds of the value of the first supply voltage reference.

8. The CMOS voltage translator of claim 1 wherein said second voltage divider comprises a pair of diode-configured transistors connected together at said second internal circuit node and connected in series with each other and between said first supply voltage reference and a third voltage reference, said second voltage divider sized to generate said second reduced voltage reference that is a third of the value of the first supply voltage reference.

9. The CMOS voltage translator of claim 5 wherein the transistors in said fourth pair are drift transistors constructed to accept a high voltage level on their drain terminals only.

10. A CMOS voltage translator, comprising:
    a differential input circuit configured to receive a differential input;
    a first reference voltage source configured to generate a first reference voltage;
    a second reference voltage source configured to generate a second reference voltage; and
    a selection circuit coupled to the first and second reference voltage sources to receive the first and second reference voltages, the selection circuit further coupled to the differential input circuit to selectively couple one of the first and second reference voltage sources to the differential input circuit in response to changes in the differential input to maintain gate voltages of transistors in the differential input circuit within a range that does not damage gate oxides of the transistors in the differential input circuit.

11. The voltage translator of claim 10 wherein the differential input circuit comprises first and second pairs of transistors cascode connected to a third pair of transistors, the second pair of transistors coupled to a fourth pair of transistors having gate terminals driven by respective non-inverted and inverted input signals.

12. The voltage translator of claim 11 wherein the selection circuit comprises fifth and sixth pair of transistors, with a connection between transistors in the fifth pair forming a first intermediate reference voltage node supplying a first intermediate reference voltage, and with a connection between the transistors in the sixth pair of transistors forming a second intermediate reference voltage node supplying a second intermediate reference voltage.

13. The voltage translator of claim 12 wherein the first, second, third, and fourth pairs of transistors are configured such that as the non-inverting input voltage increases and decreases, the first intermediate reference voltage decreases and increases, respectively, within a voltage range that does not damage the gate oxides of transistors in the differential input circuit.

14. The voltage translator of claim 11 wherein an output of the first reference voltage source is coupled to gate terminals of the third pair of transistors.

15. The voltage translator of claim 13 wherein the first reference voltage source comprises a pair of diode-connected transistors connected together at the first intermediate reference node and between a first supply voltage reference and a second supply voltage reference, the first reference voltage source sized and shaped to generate the first intermediate reference voltage that is two-thirds the value of the first supply voltage reference.

16. The voltage translator of claim 13 wherein the second reference voltage source comprises a pair of diode-connected transistors connected together at the second intermediate reference voltage node and between the first supply voltage reference and the second supply voltage reference, the second reference voltage source configured to generate the second intermediate reference voltage that is a third of the value of the first supply voltage reference.

* * * * *

UNITED STATES PATENT AND TRADEMARK OFFICE
CERTIFICATE OF CORRECTION

PATENT NO.   : 6,518,816 B2
DATED        : February 11, 2003
INVENTOR(S)  : Ettore Riccio et al.

It is certified that error appears in the above-identified patent and that said Letters Patent is hereby corrected as shown below:

<u>Column 8,</u>
Line 22, "at said input" should read as -- at an input --.
Lines 35 and 36, "to generate said second reduced voltage" should read as -- to generate a second reduced voltage --.

Signed and Sealed this

Fifth Day of August, 2003

JAMES E. ROGAN
*Director of the United States Patent and Trademark Office*